(12) United States Patent
Miyamoto et al.

(10) Patent No.: US 7,066,018 B2
(45) Date of Patent: Jun. 27, 2006

(54) METHOD OF SIMULATING A ROLLING TIRE

(75) Inventors: Kazuyoshi Miyamoto, Kobe (JP); Masaki Shiraishi, Kobe (JP)

(73) Assignee: Sumitomo Rubber Industries Ltd., Hyogo-Ken (JP)

( * ) Notice: Subject to any disclaimer, the term of this patent is extended or adjusted under 35 U.S.C. 154(b) by 0 days.

(21) Appl. No.: 10/832,289

(22) Filed: Apr. 27, 2004

(65) Prior Publication Data

US 2004/0243340 A1    Dec. 2, 2004

(30) Foreign Application Priority Data

Apr. 28, 2003    (JP) .............................. 2003-124129

(51) Int. Cl.
*E01C 23/00* (2006.01)
(52) U.S. Cl. ...................................................... 73/146
(58) Field of Classification Search ....... 73/146–146.8; 702/148
See application file for complete search history.

(56) References Cited

U.S. PATENT DOCUMENTS

| | | | |
|---|---|---|---|
| 5,930,155 | A | 7/1999 | Tohi et al. |
| 6,192,745 | B1 | 2/2001 | Tang et al. |
| 6,199,026 | B1 * | 3/2001 | Shiraishi et al. ............ 702/140 |
| 6,338,270 | B1 | 1/2002 | Mancosu et al. |
| 6,564,625 | B1 * | 5/2003 | Ishiyama ..................... 73/146 |
| 6,725,168 | B1 * | 4/2004 | Shiraishi et al. ............... 73/146 |

2002/0134149 A1    9/2002    Shiraishi et al.

FOREIGN PATENT DOCUMENTS

| | | |
|---|---|---|
| EP | 0 647 911 A2 | 4/1995 |
| EP | 0 919 941 A2 | 6/1999 |
| EP | 1 014 074 A2 | 6/2000 |
| EP | 1 262 886 A2 | 12/2002 |
| EP | 1 293 917 A2 | 3/2003 |
| JP | 11-201874 A | 7/1999 |
| JP | 2004-20229 A | 1/2004 |

OTHER PUBLICATIONS

PUCA '96 Proceedings PAM Users Conference in Asia, Nov. 14 and 15, 1996.
Tire Science and Technology, The Tire Society, vol. 25, No. 4, Oct.-Dec. 1997.
Volk H., "Einsatz der Finiten Element Methode bei der Auslegung und Optimierung von Reifen*", Kautschuk Und Gummi-Kunstoffe, Huthig Verlag, Heidelberg, DE, vol, 47, No. 10, (Oct. 1994), pp. 739-740, 742-743.

* cited by examiner

*Primary Examiner*—Max Noori
(74) *Attorney, Agent, or Firm*—Birch Stewart Kolasch & Birch LLP

(57) ABSTRACT

A method of simulating a tire rolling on a road includes modeling the tire in finite elements to make a tire model; modeling the surface of the road in finite elements to make a road model; executing a simulation in which the tire model is made to roll on the road model at a predetermined speed; and obtaining information about the tire model. The speed of the tire model is varied by repeating an increase and a decrease based on a predetermined reference speed.

8 Claims, 14 Drawing Sheets

METHOD OF SIMULATING A ROLLING TIRE

BACKGROUND OF THE INVENTION

1. Field of the Invention

This Nonprovisional application claims priority under 35 U.S.C. 119(a) on Patent Application No. 2003-124129 filed in Japan on Apr. 28, 2003, respectively, the entire contents of which are hereby incorporated by reference.

The present invention relates to a method of simulating a rolling tire which is capable of analyzing vibration characteristics during rolling on a road with high accuracy.

2. Related Art

In recent years, a computer simulation has been used for development of a tire. The computer simulation enables performance to some extent to be predicted without experimentally manufacturing the tire. As the computer simulation has been known, for example, a rolling simulation, in which a tire model is made to roll on a road model. Each model consists of finite elements. With this simulation, the vibration characteristic of the tire can be predicted by obtaining a time history of a vertical force inputted into a tire axis of the rolling tire model.

FIG. 14 is a side view partly showing a visualized tire model. Small three-dimensional elements e . . . are sequentially arranged in a tire circumferential direction at a tread surface a of the tire model. Each of the three-dimensional elements e . . . consists of a tetrahedral or hexahedral solid element or the like. The surface of each of the elements is flat. Therefore, the tread surface "a" of the tire model and a belt model, not shown, defined inside thereof are not formed into a perfect circle but a regular polygonal shape, as viewed from the side.

FIG. 11B is a graph showing the results of a simulation, in which the above-described tire model is made to roll on a road model at a constant running speed. This graph shows the results of a frequency-analysis of the time history of the vertical force inputted into the tire axis of the tire model, wherein the horizontal axis designates a frequency while a vertical axis designates a gain value thereof. As is clear from FIG. 11B, it is found that the simulation results include a peak vibration component NP, which should not have been generated in an actual tire. The peak vibration component NP is considered to be generated by summing forces for periodically lifting up vertexes "et" of the polygonal shape defined by the tread surface "a" of the tire model from the surface of the road every time the vertex collides with a road model.

It has been found that a frequency Ft of the peak vibration component NP is uniquely determined in accordance with Equation (1) below. It is not preferable that the analysis results include a vibration noise having the above-described peak.

$$Ft\ (Hz) = N \times R \tag{1}$$

Here, reference character "N" is the number of elements, which have a great rigidity and are arranged in the tire circumferential direction, of the tire model exemplified by an element made of tread rubber or an element consisting of a belt layer; and reference character "R" is a rotating speed per second of the tire model determined by a running speed V and an outer diameter of the tire model.

The tire model can be more formed into a perfect circle by increasing the number "N" of elements of the tire circumferential direction. However, such a method only transfers the frequency Ft to a high frequency region. Furthermore, the increase in the number "N" of elements markedly prolongs a calculation time of the simulation.

SUMMARY OF THE INVENTION

The present invention has been accomplished to solve the above-described problems. Therefore, a principal object of the present invention is to provide a method of simulating a rolling tire capable of reducing a peak vibration component (noise) dependent on the number of elements of a tire model from an analysis result.

A method of simulating a rolling tire according to the present invention comprises the steps of: modeling the tire in finite elements to make a tire model; modeling the surface of the road in finite elements to make a road model; executing a simulation in which the tire model is made to roll on the road model at a predetermined speed; and obtaining information about the tire model; the speed of the tire model being varied by repeating an increase and a decrease based on a predetermined reference speed.

According to the present invention, it is possible to reduce overlapping frequencies of vibration components dependent on the number of elements in the circumferential direction of the tire model with each other. Consequently, it is possible to prevent any inclusion of a peak noise in a simulation result. This gives satisfaction to a vibration analysis during rolling with high accuracy.

It is desirable that the speed of the tire model be varied as a function of time in a sin wave or zigzag manner. Moreover, it is desirable that the speed of the tire model be increased or decreased within ±20% of the reference speed. It is further desirable that the information includes at least a vertical force inputted into the tire axis of the tire model. Additionally, it is desirable that the above-described tire simulation method further comprise the steps of: frequency-analyzing a waveform as a time history of the vertical force; and calculating at least one of a gain level, a peak frequency and a gain value of a waveform obtained by the frequency-analysis.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

The present invention will become more fully understood from the detailed description given hereinbelow and the accompanying drawings which are given by way of illustration only, and thus are not limitative of the present invention, and wherein:

BRIEF DESCRIPTION OF THE DRAWINGS

FIGS. 10A and 10B are graphs illustrating the relationship between vertical force and a time as results of the rolling simulation, wherein FIG. 10A illustrates Example and FIG. 10B illustrates Comparative Example;

FIGS. 11A and 11B are graphs illustrating results of a frequency analysis, wherein FIG. 11A illustrates Example and FIG. 11B illustrates Comparative Example;

DETAILED DESCRIPTION OF THE PREFERRED EMBODIMENTS

A description will be given below of preferred embodiments according to the present invention in reference to the attached drawings.

Figure 1:
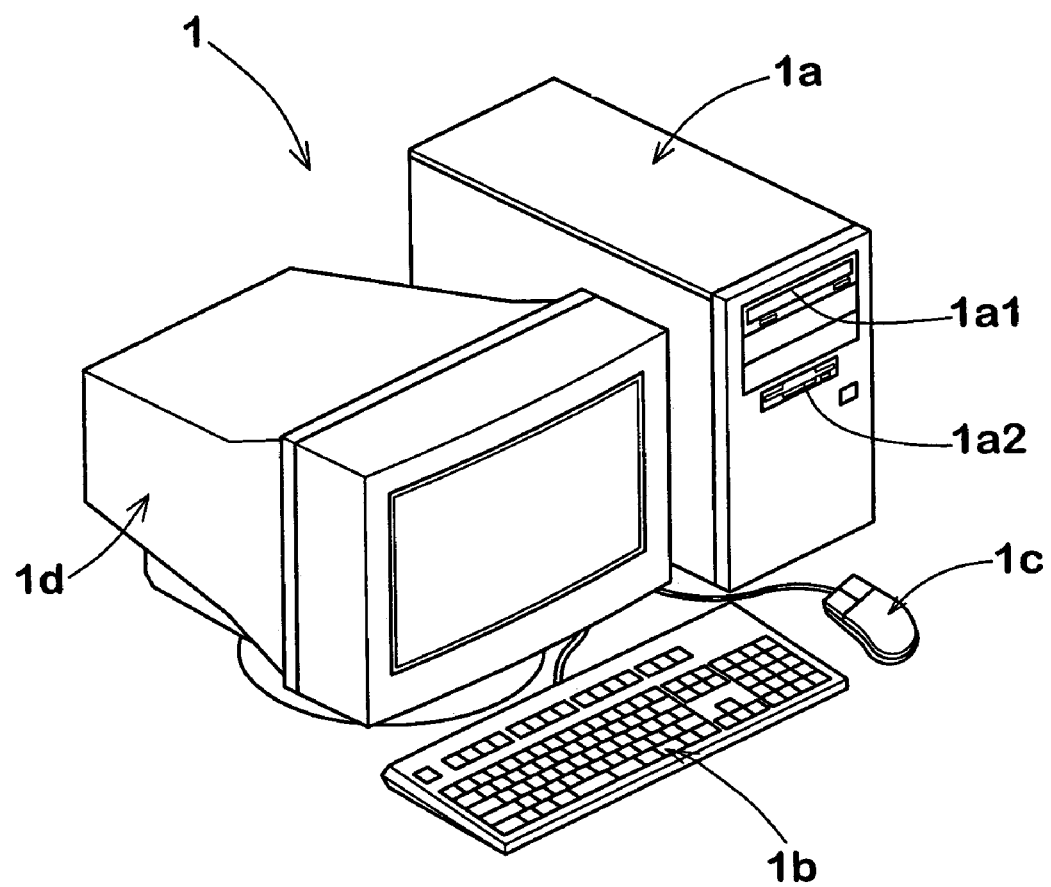
FIG. 1 is a perspective view showing a simulation apparatus for use in a present preferred embodiment.

FIG. 1 shows a computer apparatus 1 for carrying out a simulation method according to the present invention. The computer apparatus 1 includes a main unit 1a, a keyboard 1b and a mouse 1c serving as input means, and a display 1d serving as output means. Although not shown, the main unit 1a is appropriately provided with a central processing unit (abbreviated as "a CPU"), a ROM, a working memory, a large-capacity storage device such as a magnetic disk, and drives 1a1 and 1a2 for a CD-ROM or a flexible disk. The large-capacity storage device stores therein processing procedures (i.e., programs) for executing a method, described later. An Engineering Work Station and the like are preferably used as the computer apparatus 1.

Figure 2:
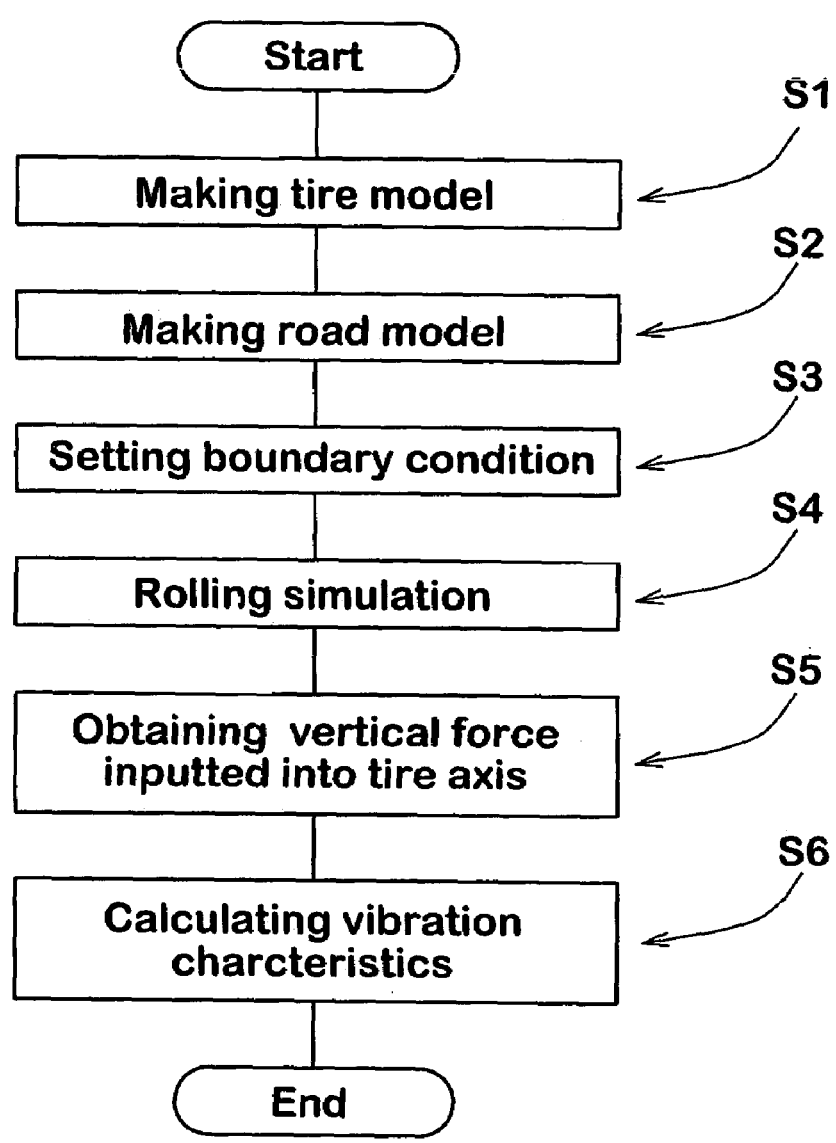
FIG. 2 is a flowchart illustrating one example of processing procedures of a simulation method for use in the present preferred embodiment.
Figure 3:
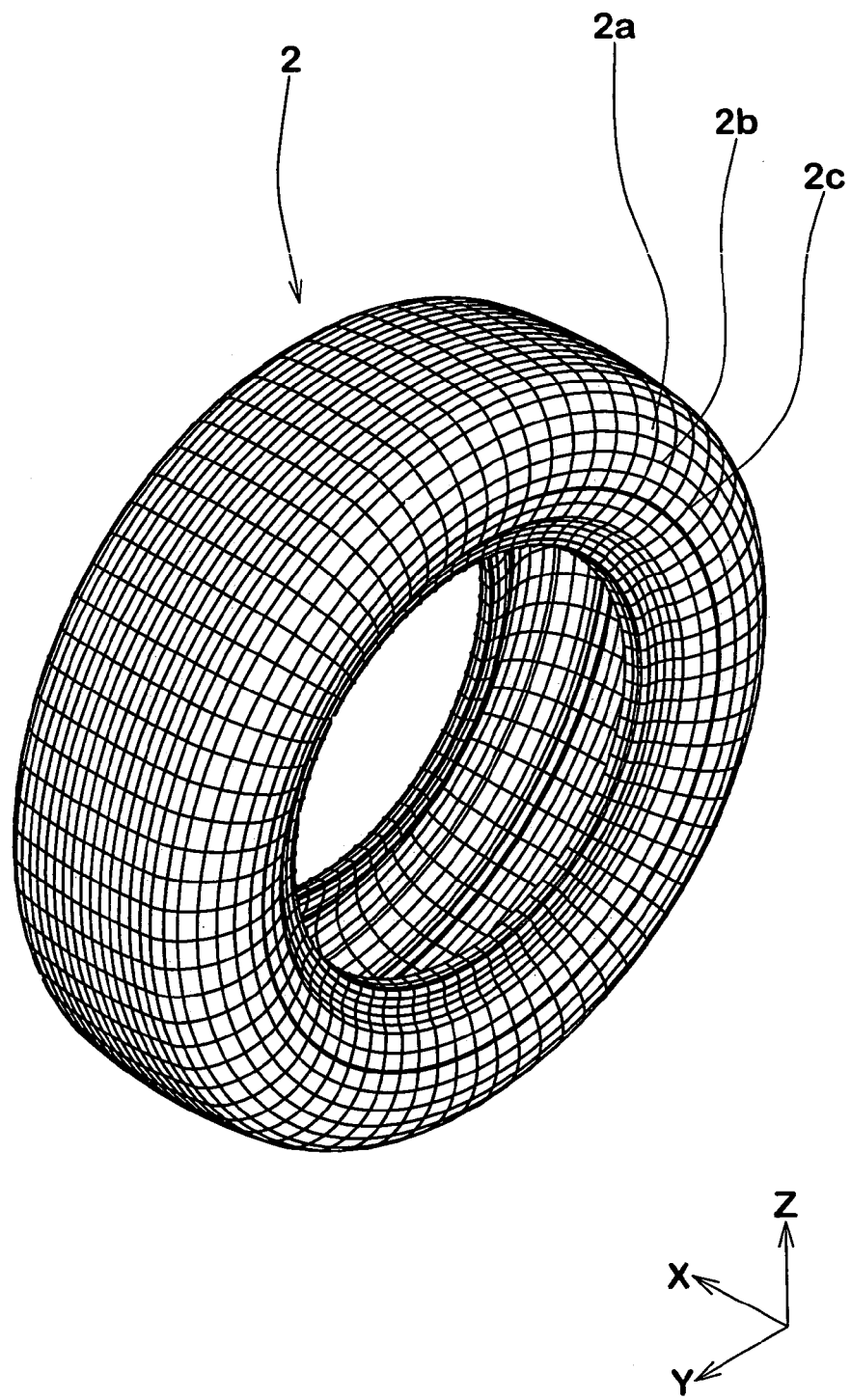
FIG. 3 is a perspective view showing one example of a tire model.
Figure 4:
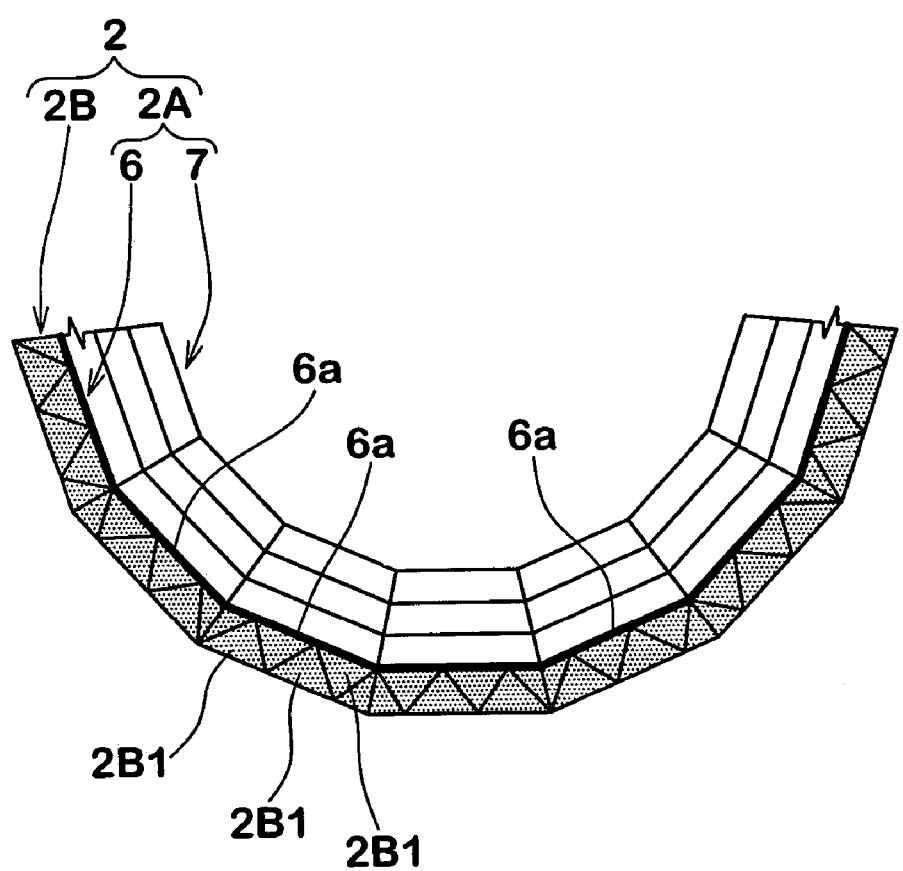
FIG. 4 is a cross-sectional view partly showing one example of the tire model.

FIG. 2 illustrates one example of processing procedures in the present preferred embodiment. In the present preferred embodiment, a tire model 2 is first modeled (step S1). FIG. 3 shows one example of the tire model 2 visually in a three-dimensional fashion. FIG. 4 schematically shows a part of a cross section of the tire model 2 cut along a tire equator.

The tire model 2 is modeled by dividing a tire to be analyzed (irrespective of the actual presence) into the finite elements 2a, 2b, 2c . . . . Each of the elements can be defined in such a manner as to be numerically analyzed. The numeric analysis signifies to freely carry out modification calculation by at least one numerically analyzing method. The numerically analyzing methods include, for example, an infinite element method, an infinite volume method, calculus of finite differences and a boundary element method. Specifically describing, for example, a coordinate value of a point in a X-Y-Z coordinate system, the shape of the element, the properties of a material (e.g., a density, a modulus of elasticity, a loss tangent and a damping coefficient) and the like are defined with respect to each of the elements 2a, 2b, 2c . . . . Consequently, the substance of the tire model 2 is expressed by numerical data which can be operated in the computer apparatus 1. Furthermore, a two-dimensional element or a three-dimensional element is used as each of the elements 2a, 2b, 2c . . . . The two-dimensional elements include, for example, a triangular membrane element and a quadrilateral membrane element. In addition, the three-dimensional elements include, for example, tetrahedral to hexahedral solid elements.

As shown in FIG. 4, the tire model 2 in the present preferred embodiment comprises a tire body 2A constituting the inside structure of the tire; and a tread rubber 2B disposed outside of the tire body 2A. The tire body 2A includes a belt model 6 shown in FIG. 5B which models a belt layer 5 shown in FIG. 5A, and a body unit 7 which models a portion (such as a carcass, a side wall or a bead) located in a tire radial direction more inward of the belt layer 5. The tread rubber 2B in the present preferred embodiment forms a portion in the tire radial direction more outward of the belt model 6.

Figure 5A:
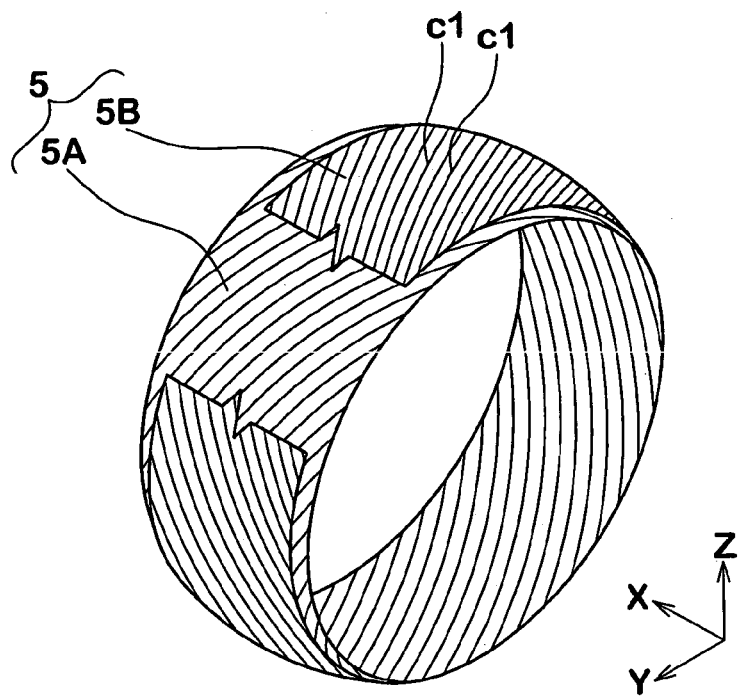
FIGS. 5A and 5B are perspective views showing a belt layer and a belt model, respectively.

As shown in FIG. 5A, the belt layer 5 of the actual tire is constituted by a plurality of belt plies 5A and 5B (two plies in the present preferred embodiment) formed into a ring shape. Furthermore, as shown in FIG. 6A, each of the belt plies 5A and 5B comprises a cord arrangement c, in which belt cords c1 are arranged with an inclination of an angle as small as about 20° with respect to the tire equator, and the topping rubber t covering the cord arrangement c.

Figure 5B:
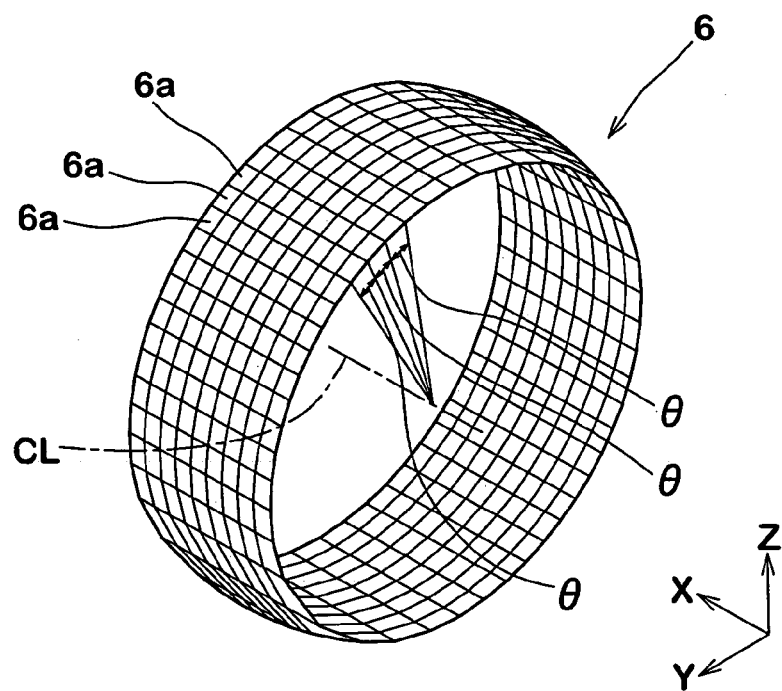

The belt model 6 shown in FIG. 5B is modeled in a ring form by sequentially arranging a plurality of quadrilateral flat elements 6a . . . around the tire axis CL. In this example, each element 6a is a same size and an angle θ around the tire axis between adjacent elements 6a, 6a in the tire circumferential direction is constant. consequently, assuming that the number of elements arranged in the tire circumferential direction is designated by n, the belt model 6 is formed into a regular n-polygonal shape, as viewed from the side. although the number n of elements of the belt model 6 arranged in the tire circumferential direction is not particularly limited, analysis accuracy is liable to be degraded if the number is too small while a measuring time is prolonged if the number is too great. from the viewpoint of this, the number n of elements is preferably determined within a range of 10 to 1,000, more preferably, within a range of 50 to 100.

Figure 6A:
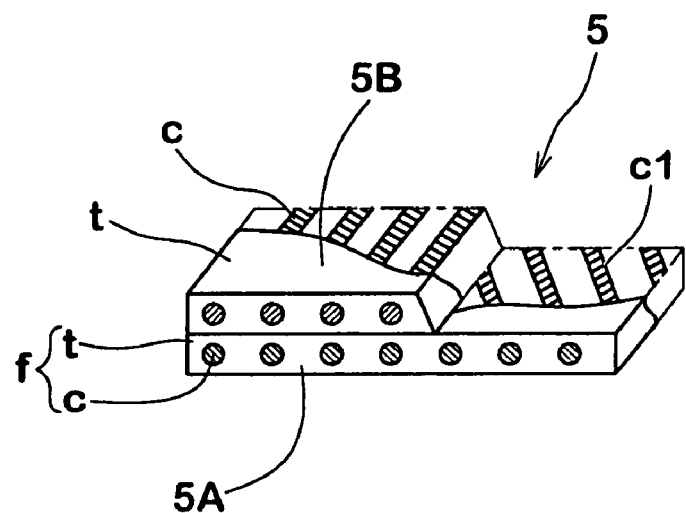
FIG. 6A is a perspective view partly showing the belt layer.
Figure 6B:
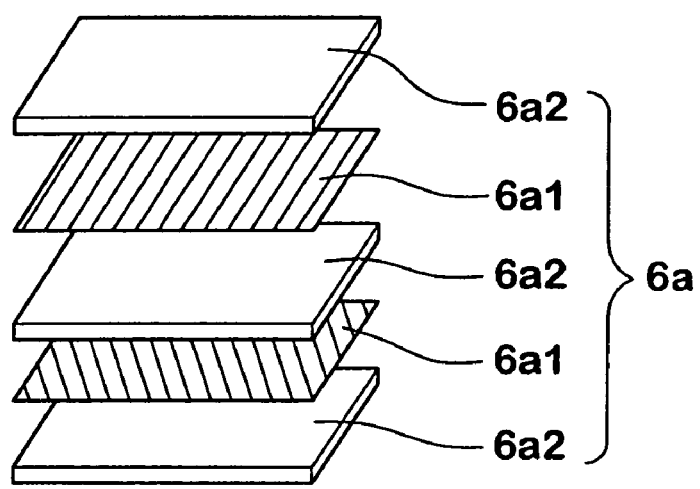
FIG. 6B is a view showing the belt layer as a model.

As shown in FIG. 6(A), an actual reinforcing cord ply 5 is such that parallel cords (c) are rubberized with topping rubber (t). Therefore, as shown in FIG. 6(B), a ply of cords (c) is modeled by quadrilateral membrane elements (6a1, 6a2), and a layer of topping rubber (t) is modeled by hexahedral solid elements 6a2. The quadrilateral membrane elements for such a cord ply are defined as an orthotropic material in which the rigidity in the cord longitudinal direction differs from the rigidity in the normal direction thereto and the rigidity in each direction is homogeneous. Although not shown, other reinforcing cord plies disposed inside of the tire such as a carcass ply and/or a band ply also can be modeled in the same manner as that with respect to the belt ply. The modeling may be carried out in other manners.

The tread rubber 2B is formed by arranging, for example, three-dimensional solid elements 2B1 . . . in the tire circumferential direction and the axial direction. In this present embodiment, the tread rubber 2B has a smooth surface without any tread grooves such as a longitudinal groove or a lateral groove. Incidentally, a tread pattern may be provided, as required. Although the tread rubber 2B in the present preferred embodiment is particularly modeled by increasing the number of divisions in the tire circumferential direction more than in the belt model 2, the outer surface as viewed from the side is a regular N-polygonal shape substantially similar to the surface of the belt model 6, as shown in FIG. 4.

The belt model 6 normally has a highest rigidity in the material constituting the tire model 2. Therefore, when the tire model 2 rolls, vibration is generated, as described above, every time the vertex of the polygonal shape of the belt model 6 is located at a surface in contact with a road model. If the rubber hardness of the tread rubber 2B is determined to be greater than that of the element of the belt model, the number of elements of the tread rubber 2B may cause noise in place of the belt model 6 or together with the belt model 6.

Figure 7:
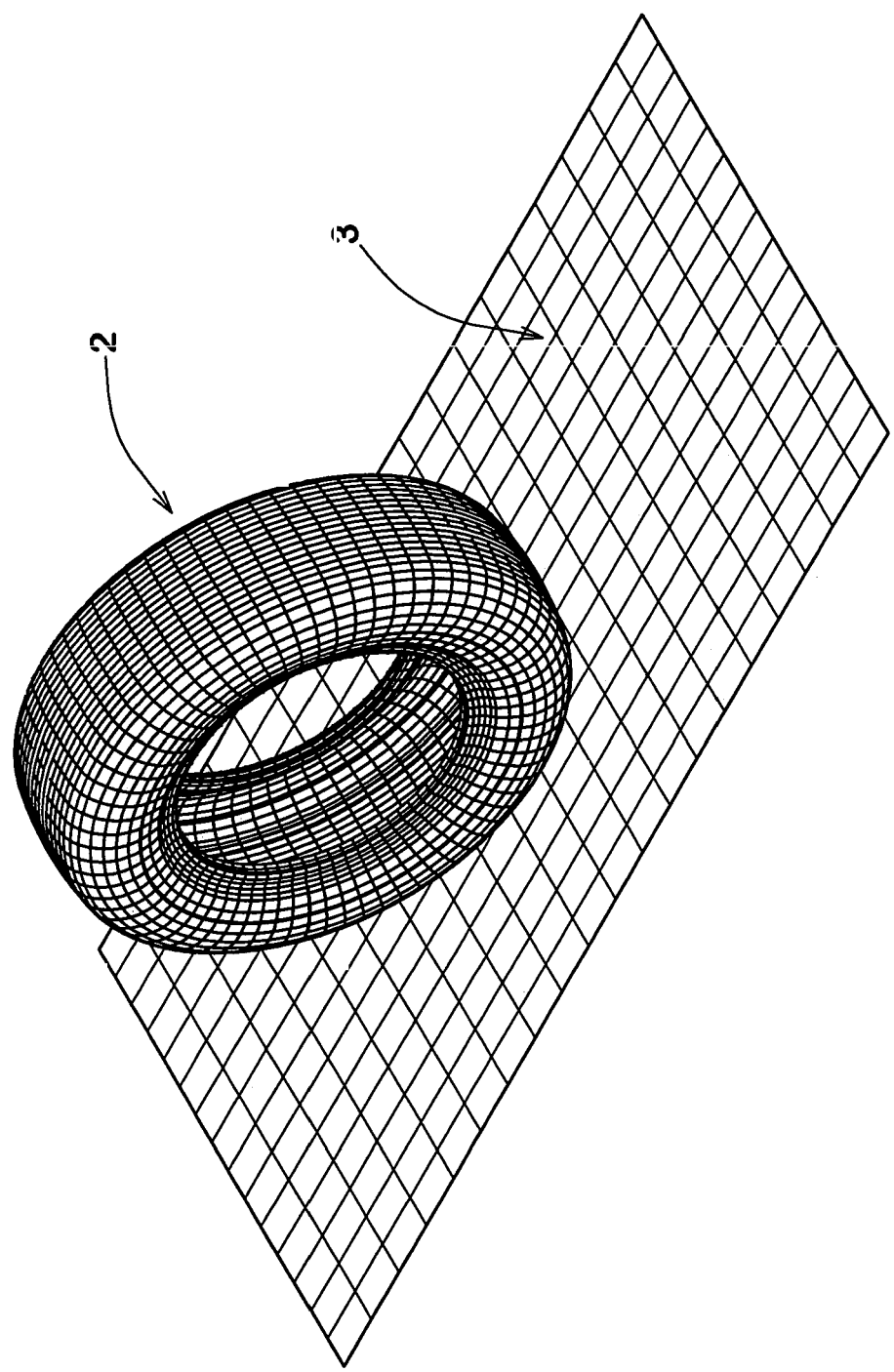
FIG. 7 is a perspective view showing one example of a rolling simulation of the tire model.

Next, the road model 3 is modeled in the present preferred embodiment (step S2). The road model 3 is a road on which the tire model 2 rolls in a rolling simulation, described later. FIG. 7 shows one example of the road model 3. In the present embodiment the road model 3 is modeled by one or more rigid surface elements, which comprise a single flat surface. Since the road model 3 is formed of a rigid surface, the road model 3 cannot be deformed even if external force acts on the road model 3. Moreover, unevenness (for example, irregular steps, grooves, undulation, ruts or the like) may be provided at the road model 3, as required. Additionally, the road model 3 may be formed into a cylindrical surface by connecting flat surfaces to each other.

Subsequently, various kinds of boundary conditions are applied to each of the models 2 and 3 (step S3) in the present preferred embodiment. The boundary conditions include at least one of, for example, the shape when the tire model 2 is disposed in a rim, a tire inflation pressure, a tire load, a slip angle, a camber angle, a moving speed V, and a frictional coefficient between the tire model 2 and the road model 3.

Here, the speed of the tire model 2 is set with variations by repeatedly increasing and decreasing a predetermined reference speed Va. In a conventional rolling simulation of the tire model, the moving speed of the tire model is kept substantially constant as a speed to be evaluated. In such a simulation, since a peak vibration component is generated, as illustrated in FIG. 11B, if the time history of vertical force of the tire model 2 is frequency-analyzed, it is difficult to analyze the vibration of the tire model.

According to the present invention, the speed of the tire model 2 is increased or decreased in reference to the predetermined reference speed. The reference speed is determined as, for example, a speed which is to be subjected to vibration evaluation. When the speed is varied by repeating an increase or a decrease, the frequency of vibration generated when the polygonal vertex of the belt ply or the tread surface collides with the road model also is varied in proportion to the speed. That is to say, the frequency of vibration is dispersed in a wide frequency band. Consequently, the same frequency components seldom overlap with each other. This gives satisfaction to prevent any inclusion of the peak vibration component, which should not have been generated in the actual tire, in the simulation result.

Figure 12:
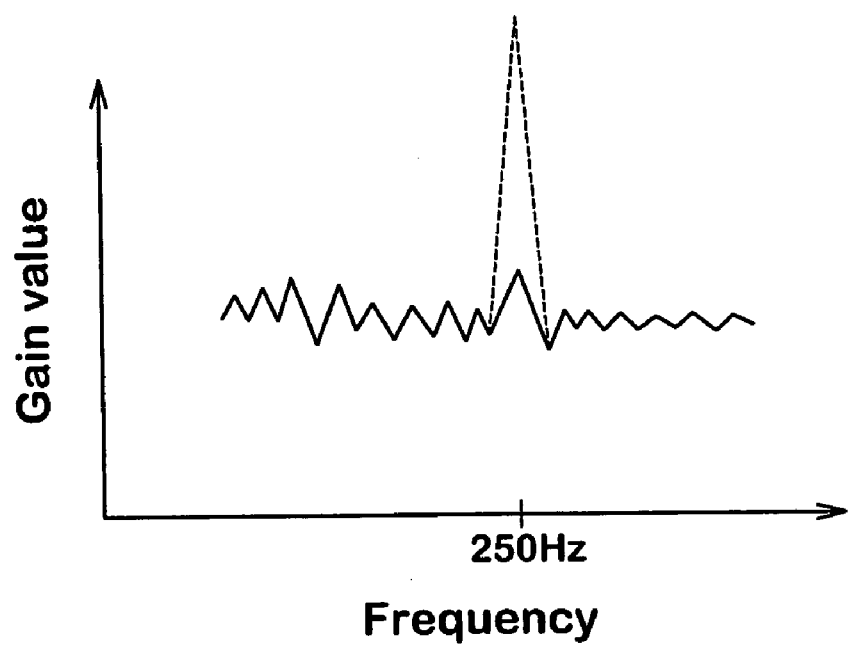
FIG. 12 is a graph schematically illustrating the simulation result after the frequency analysis.

For example, in the case where the vibration frequency at about 250 (Hz) is to be analyzed in the tire model 2, the peak vibration component often appears at about 250 (Hz) in the conventional simulation, as indicated by a chain line in FIG. 12. In this case, it is impossible to know an actual gain value of the vibration frequency at 250 (Hz). In contrast, in the present preferred embodiment, it is possible to disperse the peak vibration component caused by the polygonal shape or speed of the tire model 2. Consequently, it is possible to investigate a gain value in an analysis frequency band, as indicated by a solid line in FIG. 12, thereby improving the inside structure or material properties of the tire. Thus, it is possible to evaluate the decrease in gain value at about 250 (Hz) by another simulation after the improvement.

Figure 8A:
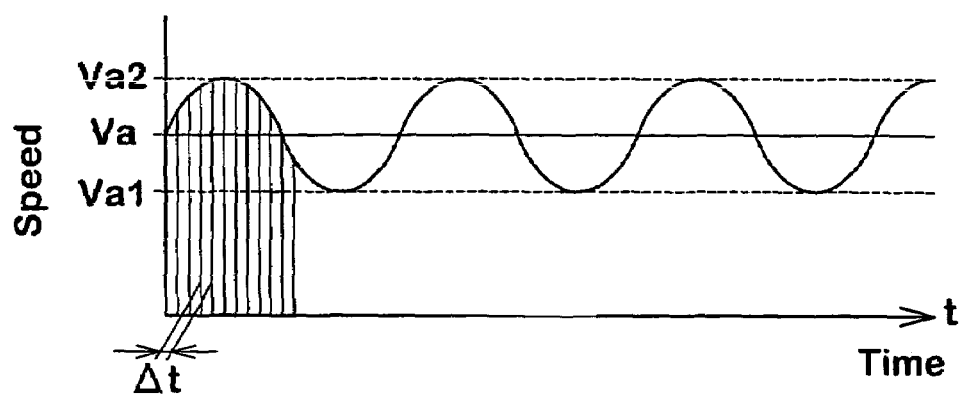
FIGS. 8A and 8B are graphs illustrating the relationship between a running speed of the tire model and a time.
Figure 8B:
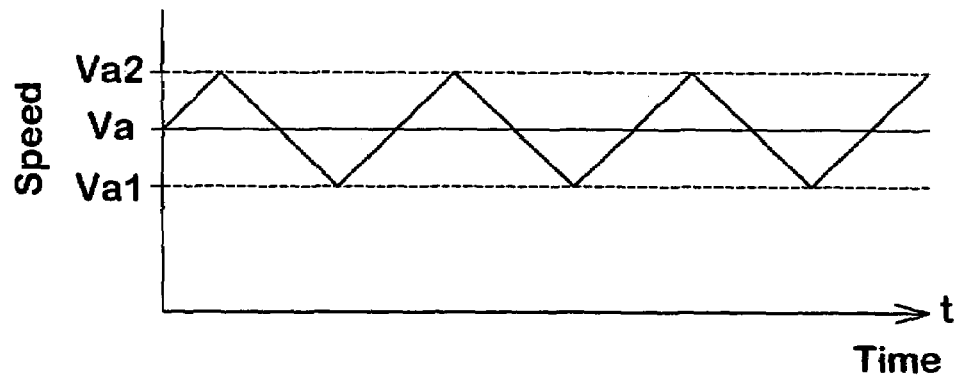

As illustrated in FIG. 8A, the speed of the tire model 2 is preferable in such a manner that the increase or decrease is repeated in a sin wave manner within a predetermined variation margin as a function of a time. In this manner, the frequency Ft is sequentially varied, to be dispersed more effectively. In the case of the periodic variation in speed, the period can be defined freely. For example, in the rolling simulation, the deformation and/or displacement of the tire model 2 are calculated per minute time increment Δt (about $9.0 \times 10^{-7}$ sec. in one example). Therefore, in the actual simulation in the computer apparatus 1, there is sequentially used a speed expressed by an amplitude obtained by pulse-modulating the sin wave sequentially drawn, as shown in FIG. 8A, per minute time Δt. In other words, the speed is intermittently varied. In the present preferred embodiment, the variation in speed is set at a frequency of 2.5 (Hz). Moreover, as shown in FIG. 8B, the speed of the tire model 2 may be repeatedly increased and decreased in a zigzag manner.

It is desirable that the speed of the tire model 2 repeats an increase and decrease within a range of ±20% of the reference speed Va. A speed to be evaluated is normally set as the reference speed Va. For example, assuming that the reference speed is designated by Va, a minimum speed at the time of decreasing is designated by Va1 and a maximum speed at the time of increasing is designated by Va2, it is desirable that a variation margin (Va-Va1) or (Va2-Va) should be set to 3% to 20% of the reference speed Va, preferably, to 5% to 20%, and more preferably, to 10% to 20%. Consequently, it is possible to obtain vibration characteristics substantially approximate to actual evaluation of the reference speed Va, thereby achieving a vibration analysis with higher accuracy. If the variation margin is too large, the vibration characteristics of the tire model 2 at the reference speed Va is liable to include an error; in contrast, if the variation margin is too small, the elimination of the peak component of the variation is liable to be insufficient. In the present preferred embodiment, although the moving speed is set as the speed of the tire model 2, it is sufficient that the speed of the tire model 2 is finally varied according to the present invention. As a consequence, it may be designed such that the rotating speed of the tire model 2 is increased and decreased.

Subsequently, in the present preferred embodiment, as shown in FIG. 7, the rolling simulation is executed by contacting the tire model 2 with the road model 3 (step S4). Methods for making the tire model 2 to roll on the road model 3 include a method in which the tire model 2 having the tire axis rotatably supported is brought into contact with the road model 3, so that frictional force is applied by moving the road model 3; and a method in which the tire model 2 with the application of the rotating speed and a translational speed is rolled on the road model 3 while the road model 3 is fixed. In the former method, the speed is increased or decreased within a range in which the moving speed of the road model 3 is set, and therefore, the moving speed of the tire model 2 is varied accordingly.

In the present preferred embodiment, the rolling simulation is executed by the finite element method. The procedures of giving the various kinds of boundary conditions to a model to be analyzed and calculating the force, displacement or the like of the entire system based on the finite element method can be performed in accordance with known examples. For example, the mass matrix, rigidity matrix and damping matrix of the element are produced based on the shape of the element or the material properties (such as a density, a Young's modulus and a damping coefficient). Furthermore, the matrix of the entire system to be simulated is produced by combining the matrices with each other. Thus, an equation is made by applying the boundary conditions to the matrix, and then, a modification simulation can be conducted by sequentially calculating the equation per minute time increment Δt in the computer apparatus 1.

Figure 9A:
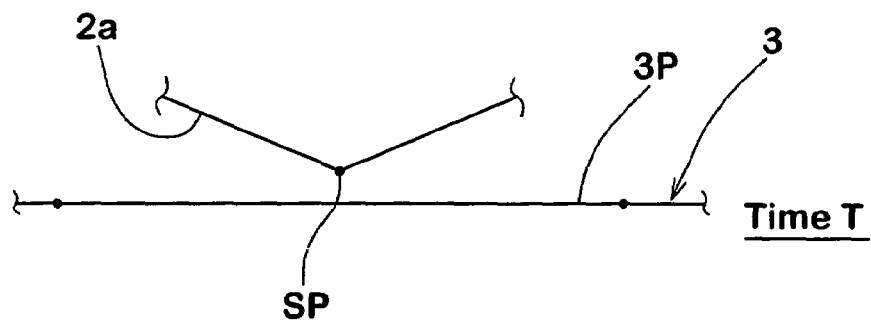
FIGS. 9A to 9C are diagrams conceptually illustrating the judgment of a contact between the tire model and a road model.
Figure 9B:
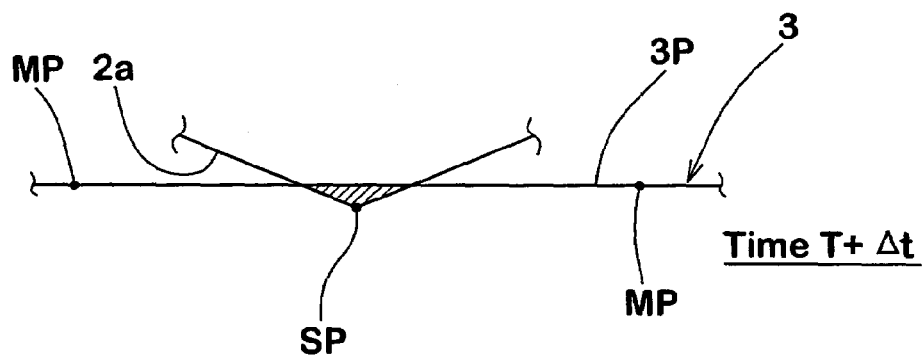
Figure 9C:
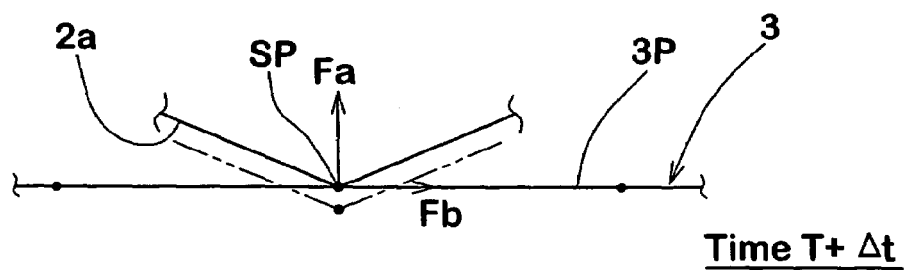

In the rolling simulation, a contact is considered between the tire model 2 and the road model 3 at all times. That is to say, as illustrated in FIGS. 9A to 9C, the position of each of the elements 2a . . . of the rotating tire model 2 is calculated per time increment Δt. At this time, it is always judged as to whether or not the element 2a and the road model 3 are brought into contact with each other. The judgment of the contact is achieved by calculating the position of a contact point of the tire model 2 with respect to the surface of the road model 3. As illustrated in FIG. 9B, in the case where a contact point SP of the tread surface of the tire model 2 is sunk into the road model 3, the position of the contact point SP of the tire model 2 is shifted up to an element plane 3P of the road model 3 in the above-described judgment of the contact, as illustrated in FIG. 9C. A reaction force according to a sinking quantity is given to the tire model 2. The reaction force includes a vertical force Fa acting in a direction perpendicular to the element plane 3P of the road model 3 and a horizontal force Fb acting in a direction parallel to the element plane 3P, which are given to the contact point SP. The force Fb may include a frictional force generated between the element plane of the road model 3 and the tire model 2. Based on the above-described judgment of the contact, the vertical force is exerted on the tire axis of the tire model 2.

Moreover, information on tire performance is obtained about the tire model 2 in rolling simulation at the predetermined intervals as numerical data in time sequence. As illustrated in, for example, FIG. 10A, the information includes the time history of the vertical force inputted into the tire axis of the tire model 2 (step S5). The information may include a traction force, a braking force or lateral force, as required. In particular, it is desirable that a frequency analysis illustrated in FIG. 11A should be carried out by subjecting a waveform of the time history of the vertical force to Fourier transform (step S6).

In order to facilitate the evaluation of the vibration performance of the tire model 2, it is preferable that at least one of the gain level, peak frequency and gain value of the waveform should be calculated based on the result of the frequency analysis. The evaluation by the use of the above-described parameters enables the vibration characteristics of the tire to be quantitatively grasped and evaluated.

Figure 13:
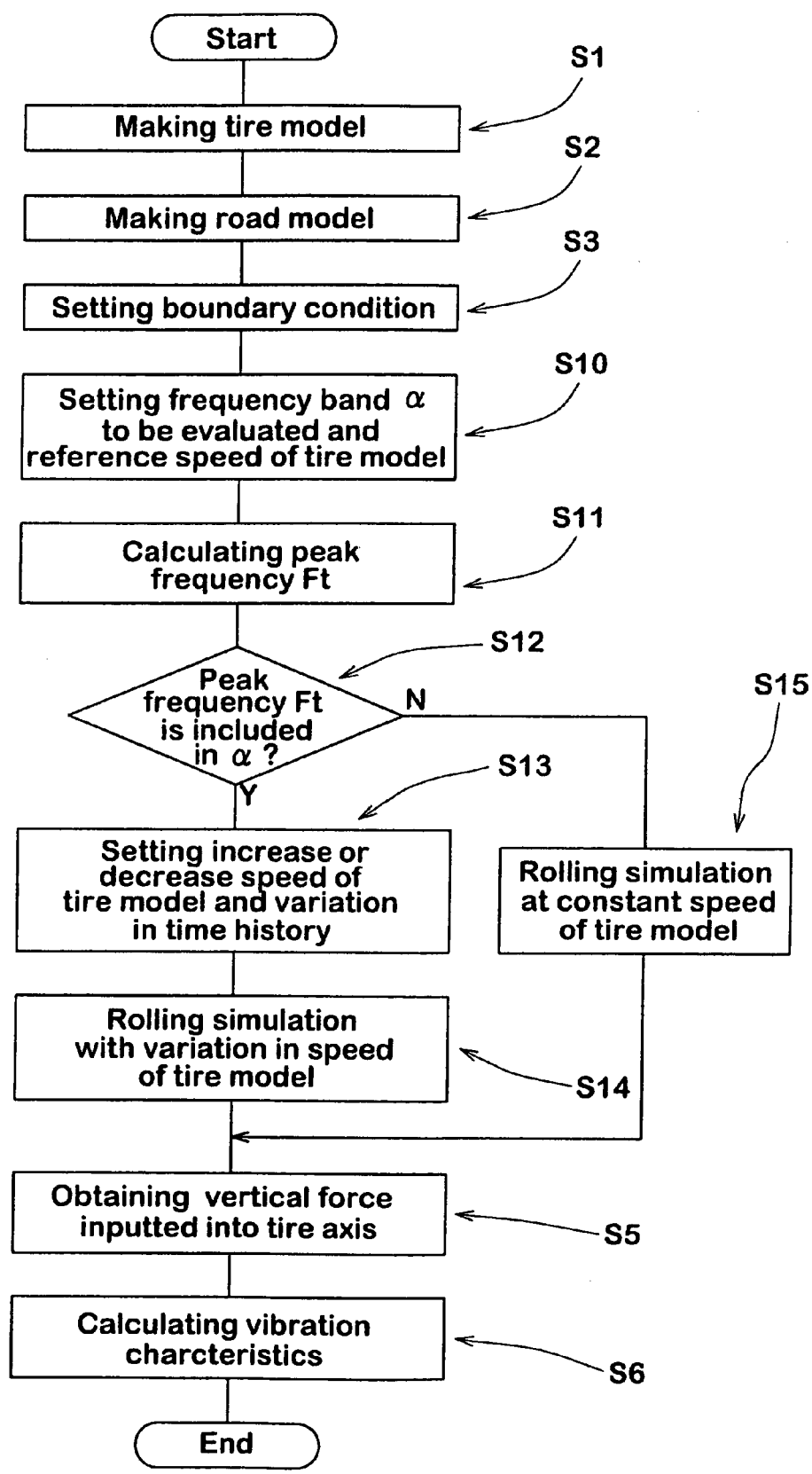
FIG. 13 is a flowchart illustrating one example of processing procedures of a simulation method for use in another preferred embodiment.
Figure 14:
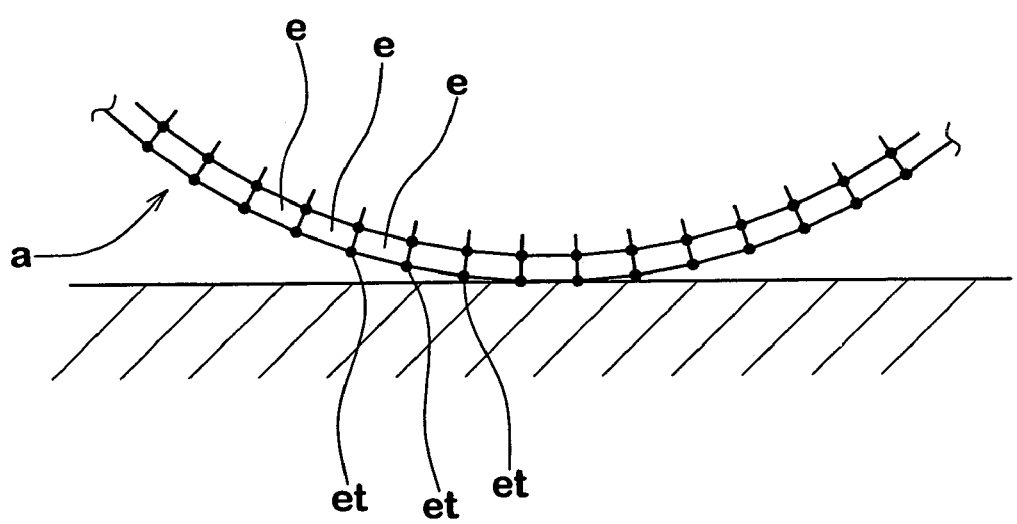
FIG. 14 is a side view showing the road model and the tire model.

FIG. 13 shows processing procedures in another preferred embodiment according to the present invention.

In FIG. 13, steps S1 to S3 are the same as those in the above-described preferred embodiment. A frequency band α of vibration to be evaluated and a reference speed of the tire model 2 are set in step S10. Here, this processing may be included in step S3, in which the boundary conditions are set. Although the frequency band a should be preferably determined within a constant range, it may be determined as one frequency value without any range.

Prior to a rolling simulation, a frequency Ft of the peak vibration component dependent on the polygonal shape and rotating speed of the tire model 2 is calculated in accordance with the above-described equation (1) (step S11). Thereafter, it is judged as to whether or not the frequency Ft of the peak vibration component is included in the evaluation frequency band (step S12). Incidentally, in the case where a difference between the frequency and the peak frequency Ft is a predetermined value or less when the frequency band α is determined as one frequency value, a judgment in step S12 is true (Y), followed by the processing.

If the result in step S12 is true (Y), a maximum speed, a minimum speed and a change in time history are set in such a manner that the speed of the tire model 2 is repeatedly increased and decreased in reference to the reference speed (step S13). As a result, the rolling simulation of the tire model 2 is executed in the above-described method (step S14). In contrast, if the result in step S12 is false (N), the rolling simulation of the tire model 2 is executed at the constant reference speed (step S15).

In the present preferred embodiment, the predicted frequency Ft of the peak vibration component is calculated by the use of the set tire model and boundary conditions. Only in the case where the peak frequency Ft is included in the frequency band of the vibration to be evaluated (in other words, only in the case where an analysis is interfered by the peak frequency Ft appearing in the frequency band α to be analyzed), the rolling simulation is executed under the condition where the speed of the tire model 2 is repeatedly increased and decreased. When the frequency Ft of the peak vibration component is not included in the frequency band to be evaluated, the rolling simulation is executed at the constant traveling speed of the tire model 2 since the peak frequency Ft never interferes with the analysis. Thus, there is produced an advantage in making a calculation cost efficient by fixing or varying the speed of the tire model 2 according to the situation.

EXAMPLE

In order to confirm an effect of the present invention, a comparison was made between the results of the simulation method according to the present invention and the simulation method in the prior art. As shown in FIG. 3, a tire model, in this example, the tire model had 23,705 nodes and 32,882 elements. Further, no tread pattern was formed on the tread surface. The modeled tire is a 195/65R15 passenger car tire. As for the belt model and the tread rubber, the number "N" of elements in the tire circumferential direction is 60. The same tire model was used in the Example and the Comparative Example.

In the Example, the reference speed was set to 60 (km/H), and then, the rolling simulation was executed by increasing or decreasing the speed in a sin wave manner within a range of ±10 km/h. In contrast in the Comparative Example, the rolling simulation was executed at a constant speed of 60 (km/H). Each of a static frictional coefficient and a dynamic frictional coefficient between the road model and the tire model was 1.0.

In the rolling simulation, a bead of the tire model was restricted by a rim width, a uniform load as the tire inflation pressure (230 kPa) was inflated, and then, a condition of rotatably pivoting the tire axis of the tire model was applied. The tire model was contacted with the road model with a vertical tire load (4.2 kN), and further, the tire model was rotated by moving the road model.

Figure 10A:
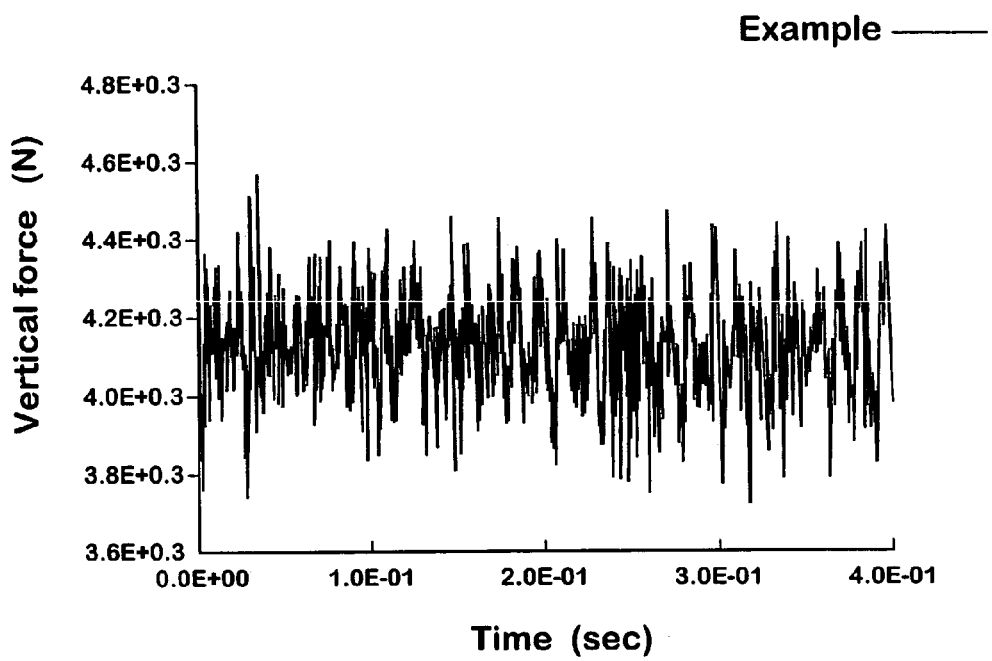
Figure 10B:
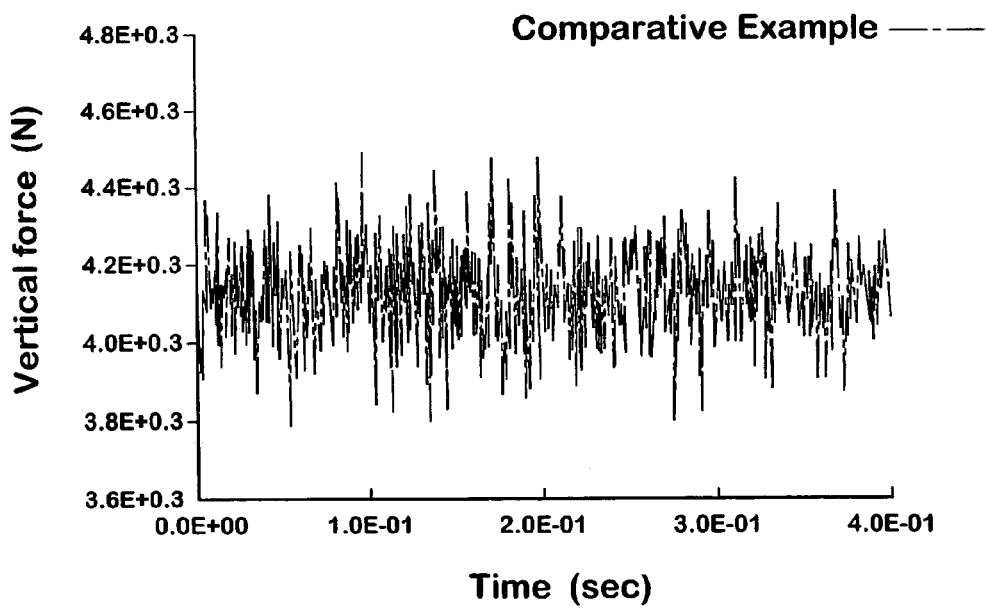
Figure 11A:
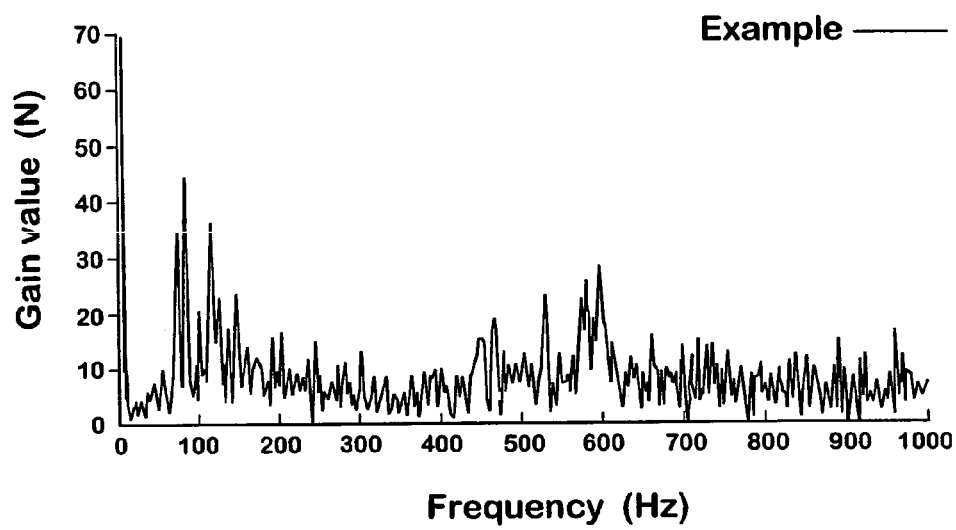
Figure 11B:
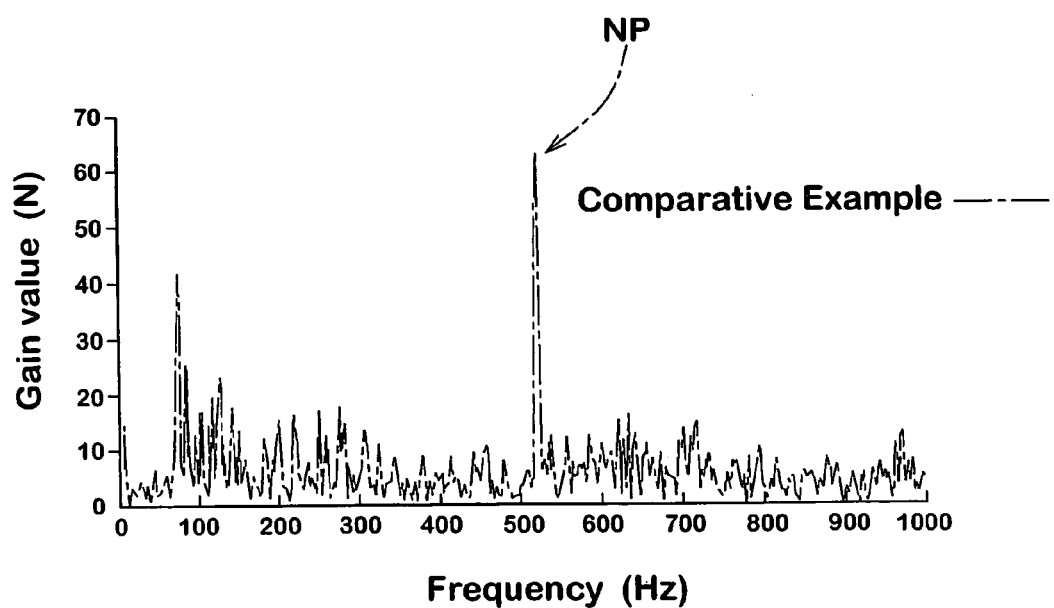

The test results are shown in FIGS. 10A, 10B, 11A and 11B. FIGS. 10A and 10B are graphs showing the relationship between the vertical force inputted into the tire axis of the tire model and the time; and FIG. 11A and 11B are graphs showing the results of the frequency analysis thereof. Further, FIGS. 10A and 11A show the Example; in contrast, FIGS. 10B and 11B show Comparative Example. In the Comparative Example, a great peak appears near 520 (Hz) in FIG. 11(B). It is construed that this is because the peak vibration component NP appears at a frequency of 516 (Hz) determined by the number of elements in the tire circumferential direction of the belt ply of the tire model being 60 and the rotating speed of the tire being about 8.6 (times/second). In contrast, in the Example, a noise component caused by the polygonal shape of the tire model is dispersed owing to sequential variations within a range of 430 (Hz) to 600 (Hz). Thus, it is confirmed that no peak vibration is included in the Example, unlike the Comparative Example.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

The invention claimed is:

1. A method of simulating a tire rolling on a road comprising the steps of:
   modeling the tire in finite elements to make a tire model;
   modeling the surface of the road in finite elements to make a road model;
   executing a simulation in which the tire model is made to roll on the road model at a moving speed repeatedly increasing and decreasing with respect to a predetermined reference speed; and
   obtaining information about the tire model.

2. The method according to claim 1, wherein the step of executing the simulation includes varying the moving speed of the tire model as a function of time in a sine wave or zigzag manner.

3. The method according to claim 1, wherein the step of executing the simulation includes varying the moving speed of the tire model within ±20% of the reference speed.

4. The method according to claim 1, wherein said information includes at least a vertical force inputted into the tire axis of the tire model.

5. The method according to claim 4, further comprising the steps of:
   frequency-analyzing a waveform as a time history of said vertical force; and
   calculating at least one of a gain level, a peak frequency and a gain value of a waveform obtained by the frequency-analysis.

6. The method according to claim 1, further comprising the step of calculating vibration characteristics of the tire.

7. The method according to claim 4, further comprising the step of calculating vibration characteristics of the tire.

8. The method according to claim 7, wherein said step of calculating vibration characteristics includes conducting a frequency analysis by subjecting a waveform of a time history of the vertical force to a Fourier transform.

* * * * *